United States Patent
Tsukamoto et al.

(10) Patent No.: US 10,109,814 B2
(45) Date of Patent: *Oct. 23, 2018

(54) ORGANIC ELECTROLUMINESCENT ELEMENT AND ORGANIC ELECTROLUMINESCENT DISPLAY PANEL WHICH EMITS LIGHT FROM THE CATHODE SIDE

(71) Applicant: Sharp Kabushiki Kaisha, Sakai, Osaka (JP)

(72) Inventors: Yuto Tsukamoto, Sakai (JP); Katsuhiro Kikuchi, Sakai (JP); Manabu Niboshi, Sakai (JP); Yoshiyuki Isomura, Sakai (JP); Hideki Uchida, Sakai (JP); Ayataka Endo, Sakai (JP); Asae Ito, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/673,447

(22) Filed: Aug. 10, 2017

(65) Prior Publication Data

US 2017/0338434 A1 Nov. 23, 2017

Related U.S. Application Data

(63) Continuation of application No. 15/026,663, filed as application No. PCT/JP2014/078024 on Oct. 22, 2014, now Pat. No. 9,768,403.

(30) Foreign Application Priority Data

Oct. 30, 2013 (JP) ................................. 2013-225631

(51) Int. Cl.
*H01L 29/08* (2006.01)
*H01L 51/50* (2006.01)
(Continued)

(52) U.S. Cl.
CPC ...... *H01L 51/5012* (2013.01); *H01L 51/5004* (2013.01); *H01L 51/5056* (2013.01);
(Continued)

(58) Field of Classification Search
CPC ............ H01L 51/5012; H01L 51/5016; H01L 51/5024; H01L 51/5056; H01L 51/5092; H01L 51/5206; H01L 51/5221
See application file for complete search history.

(56) References Cited

U.S. PATENT DOCUMENTS 9,768,403 B2 * 9/2017 Tsukamoto ......... H01L 51/5012
2006/0131562 A1 * 6/2006 Li ........................... H01L 51/002
257/40
(Continued)

OTHER PUBLICATIONS

Tsukamoto et al., "Organic Electroluminescent Element and Organic Electroluminescent Display Panel", U.S. Appl. No. 15/026,663, filed Apr. 1, 2016.

*Primary Examiner* — Khiem D Nguyen
(74) *Attorney, Agent, or Firm* — Keating & Bennett, LLP

(57) ABSTRACT

The organic electroluminescent element of the present invention includes, in the given order: an anode; a light-emitting layer; and a cathode, the light-emitting layer including a luminescent dopant layer and a luminescent host layer, the luminescent dopant layer containing a luminescent dopant material and substantially no luminescent host material, the luminescent host layer containing a luminescent host material and substantially no luminescent dopant material.

18 Claims, 8 Drawing Sheets

(51) Int. Cl.
  *H01L 51/52* (2006.01)
  *H01L 27/32* (2006.01)
  *H01L 51/00* (2006.01)

(52) U.S. Cl.
  CPC ...... *H01L 51/5076* (2013.01); *H01L 27/3244* (2013.01); *H01L 51/006* (2013.01); *H01L 51/0058* (2013.01); *H01L 51/0061* (2013.01); *H01L 51/0072* (2013.01); *H01L 51/0085* (2013.01); *H01L 51/5016* (2013.01); *H01L 51/5072* (2013.01); *H01L 51/5088* (2013.01); *H01L 51/5092* (2013.01); *H01L 51/5234* (2013.01); *H01L 2251/301* (2013.01); *H01L 2251/303* (2013.01); *H01L 2251/308* (2013.01); *H01L 2251/5315* (2013.01); *H01L 2251/552* (2013.01); *H01L 2251/558* (2013.01)

(56) References Cited

U.S. PATENT DOCUMENTS

| | | | | |
|---|---|---|---|---|
| 2006/0279203 A1* | 12/2006 | Forrest | ............... | H01L 51/0072 313/504 |
| 2008/0020237 A1* | 1/2008 | Ren | ............... | H01L 51/0085 428/704 |
| 2008/0102310 A1* | 5/2008 | Thompson | ............... | H01L 51/5036 428/690 |
| 2010/0297349 A1* | 11/2010 | Lee | ............... | C23C 14/24 427/248.1 |
| 2012/0025253 A1* | 2/2012 | Yamazaki | ............... | H01L 51/5016 257/98 |
| 2013/0264548 A1* | 10/2013 | Mizuki | ............... | C07D 403/14 257/40 |

\* cited by examiner

ORGANIC ELECTROLUMINESCENT ELEMENT AND ORGANIC ELECTROLUMINESCENT DISPLAY PANEL WHICH EMITS LIGHT FROM THE CATHODE SIDE

TECHNICAL FIELD

The present invention relates to organic electroluminescent elements (hereinafter, also referred to as "organic EL elements") and organic electroluminescent display panels (hereinafter, also referred to as "organic EL display panels"). The present invention especially relates to an organic EL element having high luminous efficacy and to an organic EL display panel including such an organic EL element.

BACKGROUND ART

Organic EL elements utilizing electroluminescence of organic materials have drawn attention as display elements used for thin display devices. Organic EL elements emit light when holes injected from the anode and electrons injected from the cathode recombine within a light-emitting layer disposed between these electrodes. Such self-luminous organic EL elements have advantages such as high-luminance light emission, a high response speed, a wide viewing angle, a thin profile, and a light weight, and are therefore expected to be applied to various fields such as display panels and illumination lamps.

The light-emitting layer of an organic EL element is usually a mixed layer, obtained by co-deposition, of a luminescent dopant material mainly providing luminescence and a luminescent host material mainly transporting holes and electrons. Studies have been made to enhance the functionality of such organic EL elements. For example, the following organic EL elements are known.

Patent Literature 1 discloses an organic EL element including a common light-emitting layer as described above and a layer whose luminescent dopant material concentration is 100 wt %.

Patent Literature 2 discloses an organic EL element including a common light-emitting layer and a layer that mainly contains a luminescent host material and does not contain a luminescent dopant material.

Patent Literature 3 discloses an organic EL element including, in place of a common light-emitting layer, an island-shaped thin film that is made of a fluorescent organic compound serving as the center of recombination to emit light and that has a smaller average thickness than a monomolecular film of a fluorescent organic compound.

Patent Literatures 4 and 5 each disclose an organic EL element including a common light-emitting layer and a metal-doped layer, obtained by doping with a metal or a metal salt, between the cathode and an organic compound layer that is disposed between the anode and the cathode.

Patent Literature 6 discloses an organic EL element including a common light-emitting layer made of a material with predetermined properties and a barrier layer with predetermined properties. Patent Literatures 7 and 8 each disclose an organic EL element including a laminate of common light-emitting layers made of a material whose properties are utilized as predetermined properties.

Non Patent Literatures 1 and 2 each disclose an organic EL element including a common light-emitting layer and an efficiency-enhancement layer.

CITATION LIST

Patent Literature

Patent Literature 1: JP 2009-48893 A
Patent Literature 2: JP 2004-253373 A
Patent Literature 3: JP 2001-267077 A
Patent Literature 4: JP 2010-16413 A
Patent Literature 5: JP 2010-45415 A
Patent Literature 6: WO 2010/134352
Patent Literature 7: JP 2010-50227 A
Patent Literature 8: JP 2008-198801 A

Non Patent Literature

Non Patent Literature 1: T. Arakane, et al., "New Deep Blue Fluorescent Materials and Their Application to High Performance", IDW '11, 2011, p. 799-802
Non Patent Literature 2: M. Kawamura, et al., "Highly Efficient Fluorescent Blue OLEDs with Efficiency-enhancement Layer", SID10 DIGEST, 2010, p. 560-563

SUMMARY OF INVENTION

Technical Problem

In an organic EL element, use of a light-emitting layer containing a mixture of a luminescent host material and a luminescent dopant material may produce a wide light-emitting region, decreasing the luminous efficacy. In particular, in the case of causing a blue fluorescent material to exhibit delayed fluorescence, the triplet-triplet fusion (TTF) phenomenon is less likely to occur, and thus the luminous efficacy may not be increased. The reasons therefor are described below.

FIG. 16 is a schematic cross-sectional view illustrating a conventional organic EL display panel. As illustrated in FIG. 16, an organic EL display panel 101c includes a substrate 2 and an organic EL element 103c disposed on the substrate 2. The organic EL element 103c includes an anode 4, a hole transport layer 7, a light-emitting layer 108b, an electron transport layer 9, and a cathode 5 in the order from the substrate 2 side. The light-emitting layer 108b has a structure in which a luminescent dopant material 19 and a luminescent host material 20 are mixed by co-deposition. In this case, the luminescent dopant material 19 is dispersed throughout the light-emitting layer 108b, and thus a light-emitting region ER3 in the organic EL element 103c is formed in the entire light-emitting layer 108b, as illustrated in FIG. 16.

In order to achieve highly efficient luminescence, the region with excitons generated in the light-emitting layer may be limited to a narrow region such that the density of the excitons is increased. In particular, in the case of causing a blue fluorescent material to exhibit delayed fluorescence, it is important to increase the density of excitons such that the TTF phenomenon occurs easily.

In the organic EL element 103c as illustrated in FIG. 16, however, the light-emitting region ER3 is formed in the entire light-emitting layer 108b. This structure gives a low density of excitons, which may lead to low luminous efficacy. In particular, in the case of causing a blue fluorescent material to exhibit delayed fluorescence, the TTF phenomenon may not easily occur and thus the luminous efficacy may decrease.

Also, in the case that the light-emitting region ER3 is formed in the entire light-emitting layer 108b, the excitons may flow into layers (e.g. hole transport layer 7, electron transport layer 9) adjacent to the light-emitting layer 108b. This phenomenon occurs when the lowest triplet state energy level (hereinafter, also referred to as the "T1 level") of the layer adjacent to the light-emitting layer 108b is lower than the T1 level of the material constituting the light-emitting layer 108b. Hence, the kind of the layer to be adjacent to the light-emitting layer 108b is limited and a layer for preventing the excitons from flowing out needs to be further disposed. As a result, the structure of the organic EL element becomes complicated to decrease the production efficiency.

Also, since the light-emitting layer 108b is formed by co-deposition of the luminescent dopant material 19 and the luminescent host material 20, it is difficult to control the deposition rate to achieve the desired weight ratio of the materials, which may decrease the production efficiency.

As described above, the conventional organic EL element 103c can still be improved in terms of a sufficient increase in the luminous efficacy and achievement of excellent production efficiency.

Patent Literature 1 discloses an organic EL element with low drive voltage and high luminous efficacy. The invention described in Patent Literature 1, however, includes a light-emitting layer obtained by mixing a luminescent dopant material and a luminescent host material as illustrated in FIG. 1 of Patent Literature 1, and thus the invention can still be improved in terms of a sufficient increase in the luminous efficacy. Also, since such a light-emitting layer is formed by co-deposition of a luminescent dopant material and a luminescent host material, the production efficiency of the light-emitting layer can be further increased.

Patent Literature 2 discloses an organic EL element that can be driven by low voltage without deterioration of the durability. The invention described in Patent Literature 2, however, includes a light-emitting layer obtained by mixing a luminescent dopant material and a luminescent host material as illustrated in FIG. 1 of Patent Literature 2, and thus the invention can still be improved in terms of a sufficient increase in the luminous efficacy. Also, since such a light-emitting layer is formed by co-deposition of a luminescent dopant material and a luminescent host material, the production efficiency of the light-emitting layer can be further increased.

Patent Literature 3 discloses an organic EL element that has a new layer structure and can effectively utilize fluorescent organic compounds. The invention described in Patent Literature 3, however, includes an island-shaped thin film providing luminescence disposed between a hole transport layer and an electron transport layer. In this structure, the hole transport layer and the electron transport layer are directly in contact with each other in a region without the island-shaped thin film, which means that recombination of holes and electrons does not occur in the island-shaped thin film. As a result, the luminous efficacy may be decreased. The invention described in Patent Literature 3 can therefore still be improved in terms of a sufficient increase in the luminous efficacy.

Patent Literature 4 discloses an organic EL element that requires low drive voltage and enables production of a high-luminance light-emitting element with high luminous efficacy. The invention described in Patent Literature 4, however, includes a light-emitting layer obtained by mixing a luminescent dopant material and a luminescent host material as illustrated in FIG. 1 of Patent Literature 4, and thus the invention can still be improved in terms of a sufficient increase in the luminous efficacy. Also, since such a light-emitting layer is formed by co-deposition of a luminescent dopant material and a luminescent host material, the production efficiency of the light-emitting layer can be further increased.

Patent Literature 5 discloses an organic EL element that can be driven by lower voltage and can control the luminescence spectrum. The invention described in Patent Literature 5, however, includes a light-emitting layer obtained by mixing a luminescent dopant material and a luminescent host material as illustrated in FIG. 1 of Patent Literature 5, and thus the invention can still be improved in terms of a sufficient increase in the luminous efficacy. Also, since such a light-emitting layer is formed by co-deposition of a luminescent dopant material and a luminescent host material, the production efficiency of the light-emitting layer can be further increased. The same improvement can be made for the inventions described in Patent Literatures 7 and 8.

Patent Literature 6 discloses an organic EL element that can efficiently cause the TTF phenomenon inside the light-emitting layer and exhibits an internal quantum efficiency significantly higher than 25% which has been regarded as the limiting value for conventional fluorescent elements. The TTF phenomenon, however, occurs between two excitons, and is less likely to occur at a low concentration of the luminescent dopant material. The invention described in Patent Literature 6 can therefore still be improved in terms of a sufficient increase in the luminous efficacy. The same improvement can be made for the inventions described in Non Patent Literatures 1 and 2.

The present invention was made in view of such a current state of the art, and aims to provide an organic EL element that exhibits sufficiently increased luminous efficacy and gives excellent production efficiency, and an organic EL display panel including such an organic EL element.

Solution to Problem

The inventors have made various studies on organic EL elements that exhibit sufficiently increased luminous efficacy and give excellent production efficiency. The inventors have then focused on the configuration of the light-emitting layer in which the luminescent dopant material and the luminescent host material are separately contained in different layers. The inventors have therefore obtained the following findings. That is, such a configuration can limit the light-emitting region to a narrow region in the vicinity of the interface between a luminescent dopant layer made of a luminescent dopant material and a luminescent host layer made of a luminescent host material, so that the excitons are denser to lead to higher luminous efficacy. Also in such a configuration, excited luminescence between the luminescent dopant material and the luminescent host material can be utilized to increase the luminous efficacy. Furthermore, since the light-emitting layer can be formed without co-deposition of the luminescent dopant material and the luminescent host material, excellent production efficiency can be achieved. Thereby, the inventors have made the present invention which can achieve the aim described above.

That is, one aspect of the present invention may be an organic electroluminescent element including, in the given order: an anode; a light-emitting layer; and a cathode, the light-emitting layer including a luminescent dopant layer and a luminescent host layer, the luminescent dopant layer containing a luminescent dopant material and substantially no luminescent host material, the luminescent host layer containing a luminescent host material and substantially no luminescent dopant material.

Another aspect of the present invention may be an organic electroluminescent display panel including a substrate; and the organic electroluminescent element disposed on the substrate.

Advantageous Effects of Invention

The present invention can provide an organic EL element that exhibits sufficiently increased luminous efficacy and gives excellent production efficiency, and an organic EL display panel including the organic EL element.

DESCRIPTION OF EMBODIMENTS

Hereinafter, the present invention is described in more detail based on the following examples with reference to drawings. The present invention is not limited to these examples. The configurations of the respective examples may be combined or modified within the spirit of the present invention.

The light-emitting layer as used herein consists of a luminescent dopant layer and a luminescent host layer. The luminescent host layer may consist of a single layer or multiple layers. In the case that the luminescent host layer consists of multiple layers, the multiple layers may partially include layer(s) containing a slight amount of a luminescent dopant material as long as the effect of the present invention can be achieved, and the concentration thereof in the layer(s) may be changed. The concentration of the luminescent dopant material in this case is preferably 20 wt % or lower. Also, the organic electroluminescence as used herein is also referred to as "organic EL". Organic EL is also referred to as organic light emitting diode (OLED).

Example 1

Example 1 relates to an organic EL element including an anode, a light-emitting layer, and a cathode in the order from the substrate side, and to an organic EL display panel including the organic EL element, wherein the light-emitting layer includes a luminescent dopant layer on the anode side and a luminescent host layer on the cathode side.

Figure 1:
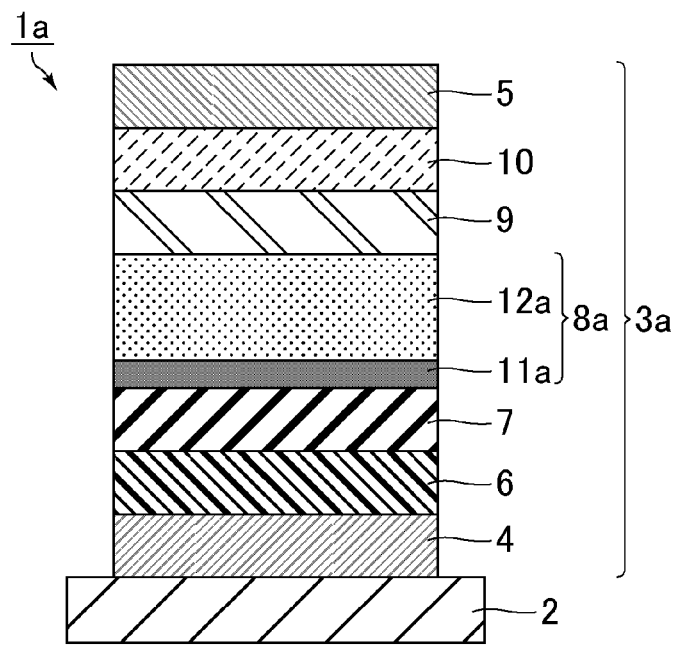
FIG. 1 is a schematic cross-sectional view illustrating an organic EL display panel of Example 1.

FIG. 1 is a schematic cross-sectional view illustrating an organic EL display panel of Example 1. As illustrated in FIG. 1, an organic EL display panel 1a includes the substrate 2 and an organic EL element 3a disposed on the substrate 2. The organic EL element 3a includes the anode 4, a hole injection layer 6, the hole transport layer 7, a light-emitting layer 8a, the electron transport layer 9, an electron injection layer 10, and the cathode 5 in the order from the substrate 2 side. The light-emitting layer 8a includes a luminescent dopant layer 11a on the anode 4 side and a luminescent host layer 12a on the cathode 5 side.

The substrate 2 used was an active matrix substrate provided with thin-film transistors. The organic EL element 3a was driven by connecting the anode 4 and the corresponding thin-film transistor. The substrate 2 can alternatively be, for example, a transparent substrate. Examples of the transparent substrate include glass substrates and plastic substrates. In the case that the transparent substrate is a flexible plastic substrate, a flexible organic EL display panel can be obtained.

The organic EL display panel 1a of Example 1 is a top emission organic EL display panel in which the anode 4 is light reflective and the cathode 5 is light transmissive, and which emits light from the cathode 5 side.

The anode 4 is a layer obtained by laminating aluminum (Al) and indium zinc oxide (IZO) in the order from the substrate 2 side (hereinafter, such a layer is also referred to as "Al/IZO") and has a thickness of 50 nm, for example. Such a light-reflective electrode can also be made of a material such as Al or indium (In), for example.

The cathode 5 is made of indium tin oxide (ITO) and has a thickness of 100 nm, for example. The ITO was deposited by sputtering. Such a light-transmissive electrode can also be made of IZO, for example.

The hole injection layer 6 is a layer obtained by co-deposition of 4,4'-bis[N-(1-naphthyl)-N-phenyl-amino]-biphenyl ($\alpha$-NPD) and molybdenum trioxide ($MoO_3$) at a ratio by weight of 80:20 and has a thickness of 40 nm, for example. The hole injection layer 6 can also be one included in a common organic EL element.

The hole transport layer 7 is made of $\alpha$-NPD and has a thickness of 30 nm, for example. The hole transport layer 7 can also be one included in a common organic EL element.

The electron transport layer 9 is made of bathophenanthroline (Bphen) and has a thickness of 15 nm, for example. The electron transport layer 9 can also be one included in a common organic EL element.

The electron injection layer 10 is made of lithium fluoride (LiF) and has a thickness of 1 nm, for example. The electron injection layer 10 can also be one included in a common organic EL element.

The luminescent dopant material constituting the luminescent dopant layer 11a was a diamine pyrene-based blue delayed fluorescence material whose concentration was 100 wt %. The thickness of the luminescent dopant layer 11a is 0.1 nm, for example. The luminescent dopant material can be a fluorescent dopant material or a phosphorescent dopant material. Examples of the phosphorescent dopant material include tris(2-phenylpyridinato)iridium(III) (Ir(ppy)3). The luminescent dopant layer 11a contains substantially no luminescent host material, and may contain a trace of impurities as well as the luminescent dopant material, for example. The expression "the luminescent dopant layer contains substantially no luminescent host material" means that the luminescent dopant layer does not contain a luminescent host material as a material having an influence on the properties of the luminescent dopant layer. Thus, the expression encompasses the case that the luminescent dopant layer contains several wt % or lower (preferably 3 wt % or lower) of a luminescent host material as a contaminant or an impurity. The concentration of the luminescent dopant material in the luminescent dopant layer 11a is preferably 90 wt % or higher, particularly preferably 100 wt %. In the case that the concentration of the luminescent dopant material is 90 wt % or higher, the luminous efficacy can be further increased by positively utilizing the TTF phenomenon. The thickness of the luminescent dopant layer 11a is preferably 5 nm or smaller, more preferably 1 nm or smaller, particularly preferably 0.1 nm or smaller. In the case that the thickness of the luminescent dopant layer 11a is 5 nm or smaller, the excitons are even denser to give even higher luminous efficacy. Also, the amount of the luminescent dopant material can be suppressed by reducing the thickness of the luminescent dopant layer 11a. Hence, even higher production efficiency can be achieved by the reduction of the cost, and mixing of colors between adjacent pixels can be sufficiently prevented.

The luminescent host material constituting the luminescent host layer 12a was BH-232 (available from Idemitsu Kosan Co., Ltd.) which is a fluorescent material having bipolarity and high electron transport ability. The fluorescent material for the luminescent host material can also be an anthracene derivative disclosed in Patent Literature 7, for example. A phosphorescent material for the luminescent host material can be a luminescent host material having high electron transport ability (electron transportable host) disclosed in Patent Literature 8, for example. Examples of such a material include imidazole derivatives. The thickness of the luminescent host layer 12a is 30 nm, for example. The luminescent host layer 12a contains substantially no luminescent dopant material. The expression "the luminescent host layer contains substantially no luminescent dopant material" means that the luminescent host layer does not contain a luminescent dopant material as a material having an influence on the properties of the luminescent host layer. Thus, the expression encompasses the case that the luminescent host layer contains a slight amount (preferably 20 wt % or lower) of a luminescent dopant material as a contaminant or an impurity. The highest occupied molecular orbital (HOMO) level of the luminescent host material is preferably lower than the HOMO level of the luminescent dopant material, and the difference between the HOMO level of the luminescent host material and the HOMO level of the luminescent dopant material is preferably 0.2 eV or less. Also, the lowest unoccupied molecular orbital (LUMO) level of the luminescent host material is preferably higher than the LUMO level of the luminescent dopant material, and the difference between the LUMO level of the luminescent host material and the LUMO level of the luminescent dopant material is preferably 0.2 eV or less.

The luminescent host material is preferably one that promotes generation of excitons from the luminescent dopant material and has bipolarity of transporting both holes and electrons. Examples of such a material include 1,3,5-tris(N-phenylbenzoimidazol-2-yl)benzene (TPBI). In this case, the hole mobility ($\mu_h$) and the electron mobility ($\mu_e$) of the luminescent host material preferably satisfy the relation of $1 < \mu_e/\mu_h$ from the viewpoint of further increasing the luminous efficacy. Here, as the bipolarity decreases, holes and electrons become less mobile, which raises the drive voltage or shortens the element life. Hence, if the value of $\mu_e/\mu_h$ is 100 or greater, such disadvantages may be more significant than an increase in the luminous efficacy. The value of $\mu_e/\mu_h$ is therefore more preferably $1 < \mu_e/\mu_h < 100$, particularly preferably $1 < \mu_e/\mu_h < 10$. In the case that the value of $\mu_e/\mu_h$ is smaller than 100, an increase in the luminous efficacy may be more significant than such disadvantages. In the case that the value of $\mu_e/\mu_h$ is smaller than 10, since the thickness of a common organic EL element is about several tens of nanometers and the light-emitting region is sufficiently on the luminescent dopant layer 11a side, the luminous efficacy can be further increased. Also in this case, the electron injection ability of the electron injection layer 10 and the electron transport ability of the electron transport layer 9 are preferably higher than the hole injection ability of the hole injection layer 6 and the hole transport ability of the hole transport layer 7, and the number of electrons is preferably greater than the number of holes in the luminescent host layer 12a when the organic EL element 3a is driven.

The organic EL element 3a of Example 1 can be driven based on the following principles.

Figure 2:
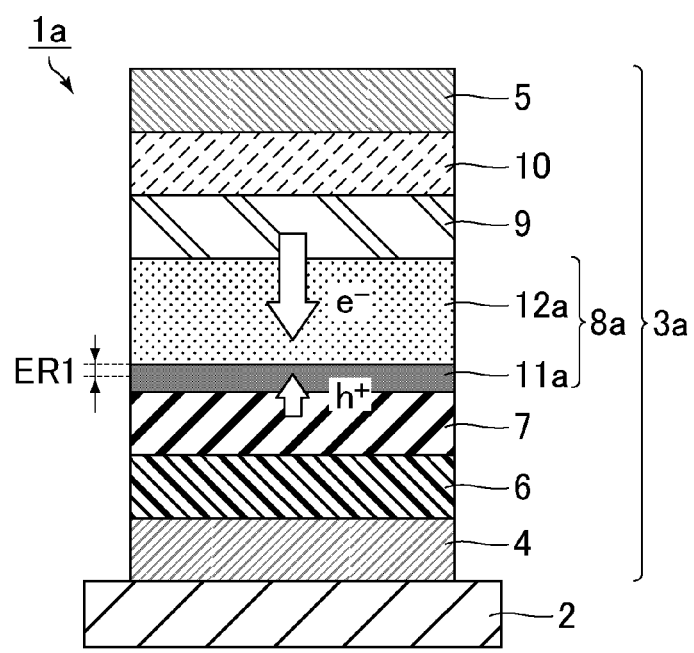
FIG. 2 is an explanatory view for explaining the driving principle of the organic EL element illustrated in FIG. 1.

FIG. 2 is an explanatory view for explaining the driving principle of the organic EL element illustrated in FIG. 1. As illustrated in FIG. 2, holes are injected from the anode 4 to the luminescent host layer 12a side of the luminescent dopant layer 11a through the hole injection layer 6 and the hole transport layer 7. Meanwhile, electrons are injected from the cathode 5 to the luminescent host layer 12a side of the luminescent dopant layer 11a through the electron injection layer 10, the electron transport layer 9, and the luminescent host layer 12a. Then, when the holes and electrons recombine in the vicinity (the luminescent host layer 12a side of the luminescent dopant layer 11a) of the interface between the luminescent dopant layer and the luminescent host layer, the organic EL element 3a emits light. In this case, a light-emitting region ER1 is limited to a narrow region in the vicinity of the interface between the luminescent dopant layer 11a and the luminescent host layer 12a, and thus the density of excitons is increased. Hence, the probability of recombination of holes and electrons is increased, so that the luminous efficacy is sufficiently increased. In the case of using a blue fluorescent material exhibiting delayed fluorescence as a dopant material, in particular, the increase in the density of excitons involves an increase in the probability of occurrence of the TTF phenomenon, and thus the luminous efficacy can be further increased. The luminous efficacy can also be sufficiently increased by transition of excitons between the luminescent dopant layer 11a and the luminescent host layer 12a.

Also, since the light-emitting layer 8a is formed without co-deposition of a luminescent dopant material and a luminescent host material, the deposition rate can be easily controlled, whereby the properties of the light-emitting layer are less likely to vary. As a result, excellent production efficiency can be achieved.

Furthermore, as described above, since the hole transport layer and the electron transport layer are in direct contact with each other in the region where the light-emitting layer is not distributed, recombination of holes and electrons does not occur in the light-emitting layer. As a result, the luminous efficacy in this structure may decrease. In the organic EL element 3a of Example 1, however, the luminescent host layer 12a is disposed on the luminescent dopant layer 11a and the hole transport layer 7 and the electron transport layer 9 are separated, so that a decrease in the luminous efficacy as described above can be sufficiently prevented.

The organic EL element 3a may optionally include a hole-blocking layer and an electron-blocking layer in addition to the components described in Example 1, and a layer having two or more functions, such as a hole injection/hole transport layer obtained by integrating the hole injection layer 6 and the hole transport layer 7 or an electron injection/electron transport layer obtained by integrating the electron transport layer 9 and the electron injection layer 10. It is also apparent that the same effects as in Example 1 can be achieved by a bottom emission organic EL display panel which has a structure obtained by reversing the order of layers in the organic EL element 3a of Example 1, in other words, a structure including the cathode 5, the electron injection layer 10, the electron transport layer 9, the luminescent host layer 12a, the luminescent dopant layer 11a, the hole transport layer 7, the hole injection layer 6, and the anode 4 in the order from the substrate 2 side, and which emits light from the cathode 5 side.

Example 2

Example 2 relates to an organic EL element including an anode, a light-emitting layer, and a cathode in the order from the substrate side, and to an organic EL display panel including the organic EL element, wherein the light-emitting layer includes a luminescent host layer on the anode side and a luminescent dopant layer on the cathode side. The organic EL element of Example 2 is the same as that of Example 1 except for the positions of the luminescent dopant layer and the luminescent host layer, and therefore the same points are not described here.

Figure 3:
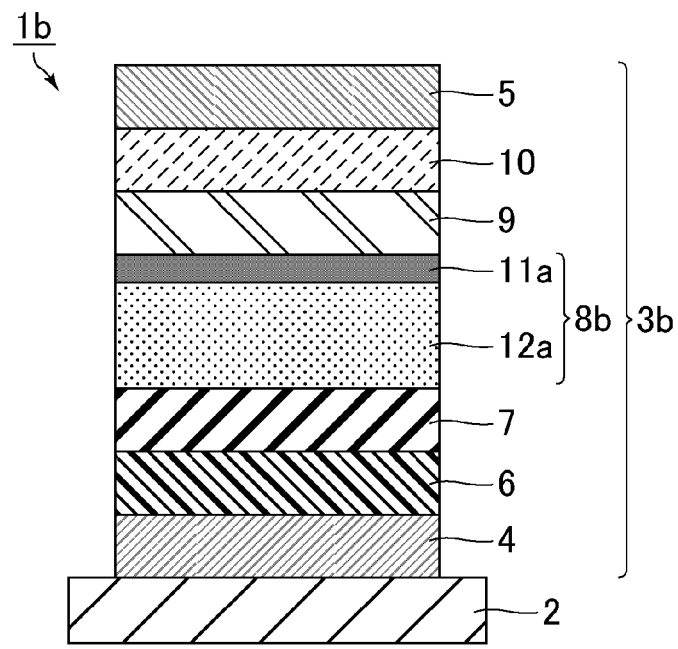
FIG. 3 is a schematic cross-sectional view illustrating an organic EL display panel of Example 2.

FIG. 3 is a schematic cross-sectional view illustrating an organic EL display panel of Example 2. As illustrated in FIG. 3, an organic EL display panel 1b includes the substrate 2 and an organic EL element 3b disposed on the substrate 2. The organic EL element 3b includes the anode 4, the hole injection layer 6, the hole transport layer 7, a light-emitting layer 8b, the electron transport layer 9, the electron injection layer 10, and the cathode 5 in the order from the substrate 2 side. The light-emitting layer 8b includes the luminescent host layer 12a on the anode 4 side and the luminescent dopant layer 11a on the cathode 5 side.

The luminescent host material constituting the luminescent host layer 12a was 4,4'-N,N'-dicarbazole-biphenyl (CBP) which is a phosphorescent material having bipolarity and high hole transport ability. The phosphorescent material for the luminescent host material can also be a luminescent host material having high hole transport ability (hole transportable host) disclosed in Patent Literature 8, for example. Examples of such a material include carbazole derivatives such as 1,3-di(N-carbazolyl)benzene (mCP) and 4,4',4"-tris (N-carbazolyl)-triphenylamine (TCTA). The thickness of the luminescent host layer 12a is 30 nm, for example. The luminescent host material is preferably one that promotes generation of excitons from the luminescent dopant material and has bipolarity of transporting both holes and electrons. In this case, the hole mobility ($\mu_h$) and the electron mobility ($\mu_e$) of the luminescent host material preferably satisfy the relation of $1 < \mu_h/\mu_e$ from the viewpoint of further increasing the luminous efficacy. Here, as the bipolarity decreases, holes and electrons become less mobile, which raises the drive voltage or shortens the element life. Hence, if the value of $\mu_h/\mu_e$ is 100 or greater, such disadvantages may be more significant than an increase in the luminous efficacy. The value of $\mu_h/\mu_e$ is therefore more preferably $1 < \mu_h/\mu_e < 100$, particularly preferably $1 < \mu_h/\mu_e < 10$. In the case that the value of $\mu_h/\mu_e$ is smaller than 100, an increase in the luminous efficacy may be more significant than such disadvantages. In the case that the value of $\mu_h/\mu_e$ is smaller than 10, since the thickness of a common organic EL element is about several tens of nanometers and the light-emitting region is sufficiently on the luminescent dopant layer 11a side, the luminous efficacy can be further increased. Also in this case, the hole injection ability of the hole injection layer 6 and the hole transport ability of the hole transport layer 7 are preferably higher than the electron injection ability of the electron injection layer 10 and the electron transport ability of the electron transport layer 9, and the number of holes is preferably greater than the number of electrons in the luminescent host layer 12a when the organic EL element 3b is driven.

The organic EL element 3b of Example 2 can be driven based on the following principles.

Figure 4:
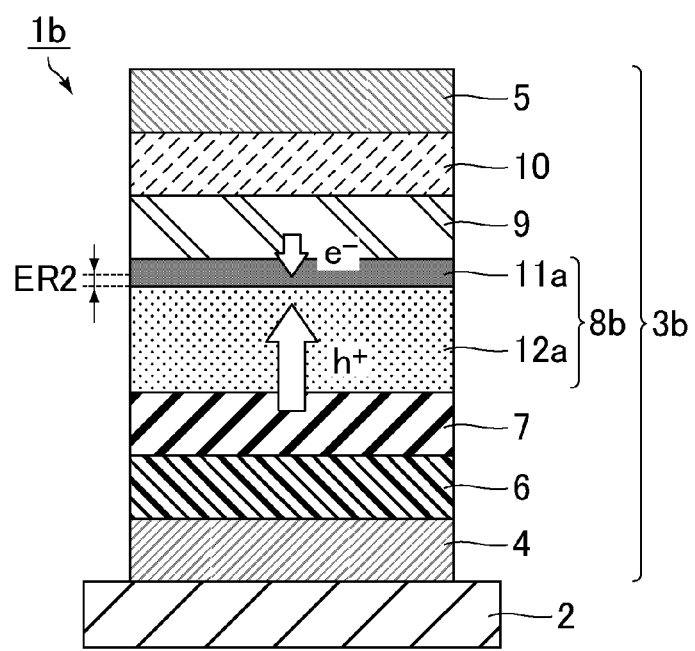
FIG. 4 is an explanatory view for explaining the driving principle of the organic EL element illustrated in FIG. 3.

FIG. 4 is an explanatory view for explaining the driving principle of the organic EL element illustrated in FIG. 3. As illustrated in FIG. 4, holes are injected from the anode 4 to the luminescent host layer 12a side of the luminescent dopant layer 11a through the hole injection layer 6, the hole transport layer 7, and the luminescent host layer 12a. Meanwhile, electrons are injected from the cathode 5 to the luminescent host layer 12a side of the luminescent dopant layer 11a through the electron injection layer 10 and the electron transport layer 9. Then, when the holes and electrons recombine in the vicinity (the luminescent host layer 12a side of the luminescent dopant layer 11a) of the interface between the luminescent dopant layer and the luminescent host layer, the organic EL element 3b emits light. In this case, a light-emitting region ER2 is limited to a narrow region in the vicinity of the interface between the luminescent dopant layer 11a and the luminescent host layer 12a, and thus the density of excitons is increased. Hence, the luminous efficacy can be sufficiently increased as in Example 1.

Also, since the light-emitting layer 8b is formed without co-deposition of a luminescent dopant material and a luminescent host material, excellent production efficiency can be achieved as in Example 1.

The organic EL element 3b may optionally include a hole-blocking layer and an electron-blocking layer in addition to the components described in Example 2, and a layer having two or more functions, such as a hole injection/hole transport layer obtained by integrating the hole injection layer 6 and the hole transport layer 7 or an electron injection/electron transport layer obtained by integrating the electron transport layer 9 and the electron injection layer 10. It is also apparent that the same effects as in Example 2 can be achieved by a bottom emission organic EL display panel which has a structure obtained by reversing the order of layers in the organic EL element 3b of Example 2, in other words, a structure including the cathode 5, the electron injection layer 10, the electron transport layer 9, the luminescent dopant layer 11a, the luminescent host layer 12a, the hole transport layer 7, the hole injection layer 6, and the anode 4 in the order from the substrate 2 side, and which emits light from the cathode 5 side.

Example 3

Example 3 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Also in this case, a doped electron transport layer made of a material obtained by doping a substance having electron transport ability with an n-type impurity is disposed between the luminescent host layer and the cathode. The organic EL element of Example 3 is the same as that of Example 1 except that the doped electron transport layer is disposed in place of the electron transport layer and that the electron injection layer is not disposed. Therefore, the same points are not described here.

Figure 5:
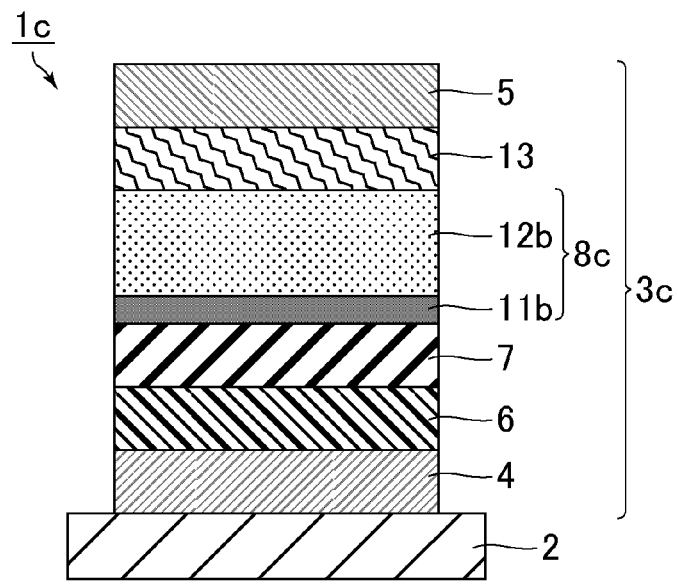
FIG. 5 is a schematic cross-sectional view illustrating an organic EL display panel of Example 3.

FIG. 5 is a schematic cross-sectional view illustrating an organic EL display panel of Example 3. As illustrated in FIG. 5, an organic EL display panel 1c includes the substrate 2 and an organic EL element 3c disposed on the substrate 2. The organic EL element 3c includes the anode 4, the hole injection layer 6, the hole transport layer 7, a light-emitting layer 8c, a doped electron transport layer 13, and the cathode 5 in the order from the substrate 2 side. The light-emitting layer 8c includes a luminescent dopant layer 11b on the anode 4 side and a luminescent host layer 12b on the cathode 5 side. The luminescent dopant layer 11b is the same as the luminescent dopant layer 11a of Example 1 except that the thickness of the layer 11b is 1 nm. The luminescent host layer 12b is the same as the luminescent host layer 12a of Example 1 except that the thickness of the layer 12b is 29 nm. Also, the T1 level (2.5 eV) of the hole transport layer 7 is higher than the T1 level (2.0 eV) of the luminescent dopant layer 11b.

The doped electron transport layer 13 was obtained by doping a material constituting an electron transport layer, Bphen, with an n-type impurity, cesium carbonate ($Cs_2CO_3$), to a concentration of 1 wt %, and had a thickness of 15 nm. The n-type impurity can also be an oxide or carbonate of an alkali metal or an oxide or carbonate of an alkaline earth metal, such as lithium oxide ($Li_2O$) or barium carbonate ($BaCo_3$). Here, $BaCo_3$ is more preferred because elements with a larger atomic weight are less susceptible to thermal diffusion or the like and are more reliable.

Since the light-emitting layer 8c of the organic EL element of Example 3 has the same configuration as the light-emitting layer 8a of the organic EL element of Example 1, it is apparent that the light-emitting region is limited to a narrow region in the vicinity of the interface between the luminescent dopant layer 11b and the luminescent host layer 12b and thereby the luminous efficacy is sufficiently increased.

Also, since the light-emitting layer 8c is formed without co-deposition of a luminescent dopant material and a luminescent host material, excellent production efficiency can be achieved as in Example 1.

The organic EL display panel of Example 3 can further achieve the following additional effects as well as the effects described above.

Figure 16:
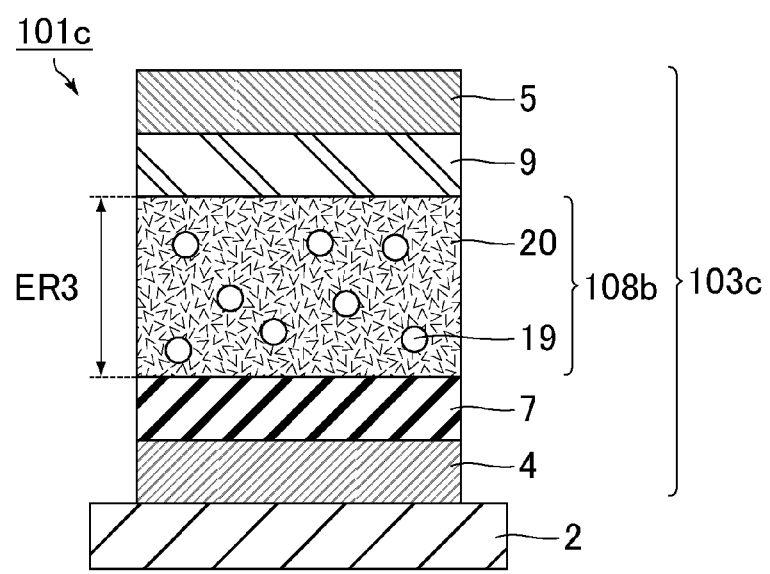
FIG. 16 is a schematic cross-sectional view illustrating a conventional organic EL display panel.

The first additional effect is described. In the case that ITO or IZO is used to form the cathode 5 in the conventional organic EL display panel 101c as illustrated in FIG. 16 in order to produce a top emission organic EL display panel, the electron injection performance to the electron transport layer side can be degraded if the work function (about −5 eV) of ITO or IZO and the LUMO level of the electron transport layer are significantly different. The organic EL display panel 1c of Example 3 can sufficiently prevent such degradation of the electron injection performance because it includes the doped electron transport layer 13 between the luminescent host layer 12b and the cathode 5 and the doped electron transport layer 13 itself is charged to be able to be ohmically connected to the cathode 5. Also, since the electron transport ability of the doped electron transport layer 13 is high, bringing the LUMO level of the doped electron transport layer 13 closer to the LUMO level of the luminescent host layer 12b facilitates injection of electrons into the luminescent host layer 12b.

Next, the second additional effect is described. In the case that ITO or IZO is used to form the cathode 5 in the conventional organic EL display panel 101c as illustrated in FIG. 16 in order to produce a top emission organic EL display panel, secondary electrons and plasma emitted in the formation (e.g. sputtering) of the cathode 5, for example, may damage the layers (e.g. electron transport layer 9) formed already, deteriorating the functions of the layers. The organic EL display panel 1c of Example 3 can sufficiently prevent deterioration of the electron transport ability of the doped electron transport layer 13 even if the surface of the doped electron transport layer 13 is damaged in the formation of the cathode 5 because the organic EL display panel 1c includes the doped electron transport layer 13 that is disposed between the luminescent host layer 12b and the cathode 5 and is charged. Also, intentionally providing a large thickness to the doped electron transport layer 13 sufficiently prevents damages on the layers formed already before the cathode 5. From the viewpoint of sufficiently preventing such damages, the thickness of the doped electron transport layer 13 is preferably 5 nm or greater, more preferably 10 nm or greater. Here, even if the thickness of the doped electron transport layer 13 is increased to about several hundreds of nanometers, the transparency of the layer is retained, and thus there will be no optical loss.

As described above, in the case of a mixture layer of the luminescent dopant material 19 and the luminescent host material 20 such as the light-emitting layer 108b of the conventional organic EL display panel 101c as illustrated in FIG. 16, the light-emitting region ER3 is formed in the entire light-emitting layer 108b. In this case, there are light-emitting points also on the cathode 5 side of the light-emitting layer 108b. Here, in the case that the conventional organic EL display panel 101c includes the doped electron transport layer 13 used in Example 3 on the light-emitting layer 108b, excitons generated on the cathode 5 side of the light-emitting layer 108b are quenched by the doped electron transport layer 13, so that the luminous efficacy is decreased. Hence, in order to dispose the doped electron transport layer 13 used in Example 3 in the conventional organic EL display panel 101c, another buffer layer (e.g. electron transport layer) is required between the light-emitting layer 108b and the doped electron transport layer 13. This structure unfortunately decreases the production efficiency. The organic EL display panel 1c of Example 3, however, does not cause the excitons to be quenched by the doped electron transport layer 13 because it includes the luminescent host layer 12b disposed between the luminescent dopant layer 11b and the doped electron transport layer 13 to separate the luminescent dopant layer 11b and the doped electron transport layer 13.

Comparative Example 1

Comparative Example 1 relates to an organic EL element including an anode, a light-emitting layer, and a cathode in the order from the substrate side, and to an organic EL display panel including the organic EL element, wherein the light-emitting layer is a mixture layer obtained by mixing a luminescent dopant material and a luminescent host material. The organic EL element of Comparative Example 1 is the same as that of Example 3 except for the configuration of the light-emitting layer, and thus the same points are not described here.

Figure 6:
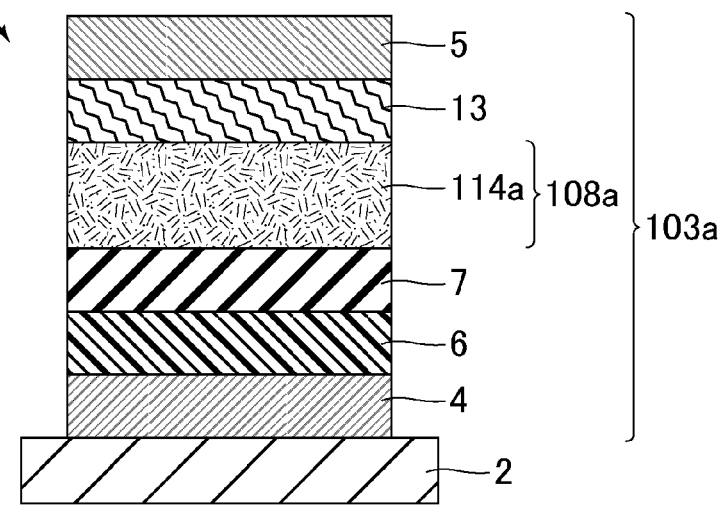
FIG. 6 is a schematic cross-sectional view illustrating an organic EL display panel of Comparative Example 1.

FIG. 6 is a schematic cross-sectional view illustrating an organic EL display panel of Comparative Example 1. As illustrated in FIG. 6, an organic EL display panel 101a includes the substrate 2 and an organic EL element 103a disposed on the substrate 2. The organic EL element 103a includes the anode 4, the hole injection layer 6, the hole transport layer 7, a light-emitting layer 108a, the doped electron transport layer 13, and the cathode 5 in the order from the substrate 2 side. The light-emitting layer 108a is a mixture layer 114a obtained by mixing a luminescent dopant material and a luminescent host material.

The mixture layer 114a was obtained by co-deposition of Ir(ppy)3 (luminescent dopant material) and CBP (luminescent host material) at a ratio by weight of 90:10, and had a thickness of 30 nm.

Comparative Example 2

Comparative Example 2 relates to an organic EL element including an anode, a light-emitting layer, and a cathode in the order from the substrate side, and to an organic EL display panel including the organic EL element, wherein the light-emitting layer is a mixture layer obtained by mixing a luminescent dopant material and a luminescent host material. The organic EL element of Comparative Example 2 is the same as that of Example 3 except for the configuration of the light-emitting layer, the configuration of the cathode, and use of a layer obtained by laminating an electron transport layer and an electron injection layer in the given order in place of the doped electron transport layer. Therefore, the same points are not described here.

Figure 7:
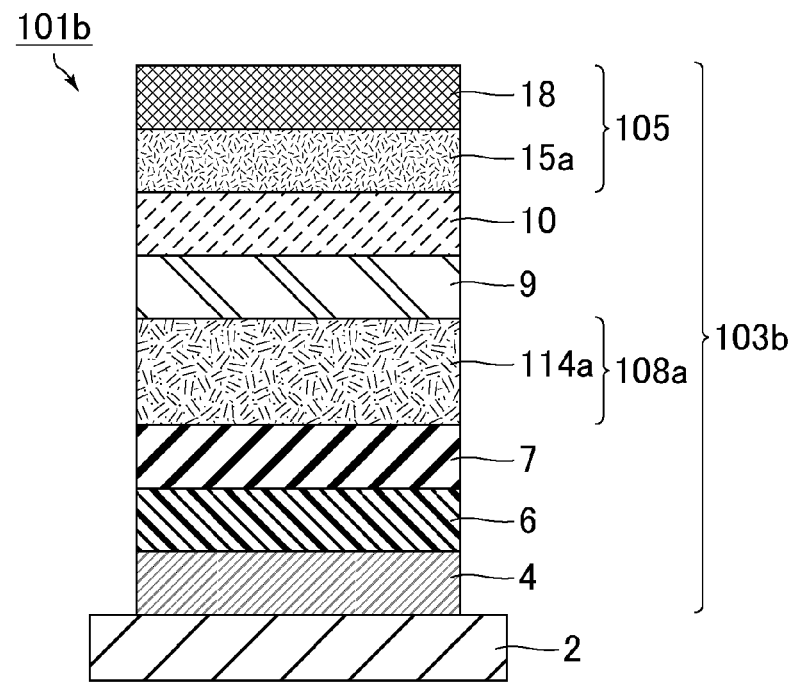
FIG. 7 is a schematic cross-sectional view illustrating an organic EL display panel of Comparative Example 2.

FIG. 7 is a schematic cross-sectional view illustrating an organic EL display panel of Comparative Example 2. As illustrated in FIG. 7, an organic EL display panel 101b includes the substrate 2 and an organic EL element 103b disposed on the substrate 2. The organic EL element 103b includes the anode 4, the hole injection layer 6, the hole transport layer 7, the light-emitting layer 108a, the electron transport layer 9, the electron injection layer 10, and a cathode 105 in the order from the substrate 2 side. The light-emitting layer 108a is the mixture layer 114a obtained by mixing a luminescent dopant material and a luminescent host material. The cathode 105 includes a metal layer 15a and a transparent conductive layer 18 in the order from the substrate 2 side.

The electron transport layer 9 was made of Bphen and had a thickness of 15 nm.

The electron injection layer 10 was made of lithium fluoride (LiF) and had a thickness of 0.5 nm.

The metal layer 15a constituting the cathode 105 was made of an alloy of magnesium (Mg) and silver (Ag) (hereinafter, such an alloy is also referred to as "Mg—Ag") and had a thickness of 1 nm. The transparent conductive layer 18 constituting the cathode 105 was made of ITO and had a thickness of 100 nm.

[Analysis Results]

The organic EL elements of Comparative Examples 1 and 2 were compared to that of Example 3 in terms of the luminous efficacy. The luminous efficacy was determined with a luminance of 1000 cd/m$^2$ with an FPD module measurement system (MD series, Otsuka Electronics Co., Ltd.) equipped with a luminance colorimeter (BM-5A, Topcon Technohouse Corp.) as a detector.

The luminous efficacy of the organic EL element of Comparative Example 1 decreased by 20% compared to the luminous efficacy of the organic EL element of Example 3. The luminous efficacy decreased presumably because the light-emitting layer 108a of the organic EL element of Comparative Example 1 was a mixture layer of a luminescent dopant material and a luminescent host material, and thus the light-emitting region extended. The decrease was also presumably associated with the structure of the organic EL element of Comparative Example 1 in which the doped electron transport layer 13 was disposed on the light-emitting layer 108a, so that the excitons generated on the doped electron transport layer 13 side of the light-emitting layer 108a were quenched by the doped electron transport layer 13.

The organic EL element of Comparative Example 2 hardly emitted light. This is presumably because the Mg—Ag layer (metal layer 15a) whose thickness was reduced to emit light from the cathode 105 side was damaged when an ITO layer (transparent conductive layer 18) was formed, and the layers such as the electron injection layer 10 and the electron transport layer 9 were eventually damaged.

As described above, since the organic EL element of Example 3 has a structure in which the light-emitting layer 8c contains the luminescent dopant material and the luminescent host material separately in different layers and the doped electron transport layer 13 is disposed, the luminous efficacy can be sufficiently increased and the damage in the formation of the cathode 5 can be sufficiently prevented.

Example 4

Example 4 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Here, the luminescent host layer is made of two luminescent host materials. The organic EL element of Example 4 is the same as that of Example 3 except for the configuration of the luminescent host layer. Therefore, the same points are not described here.

Figure 8:
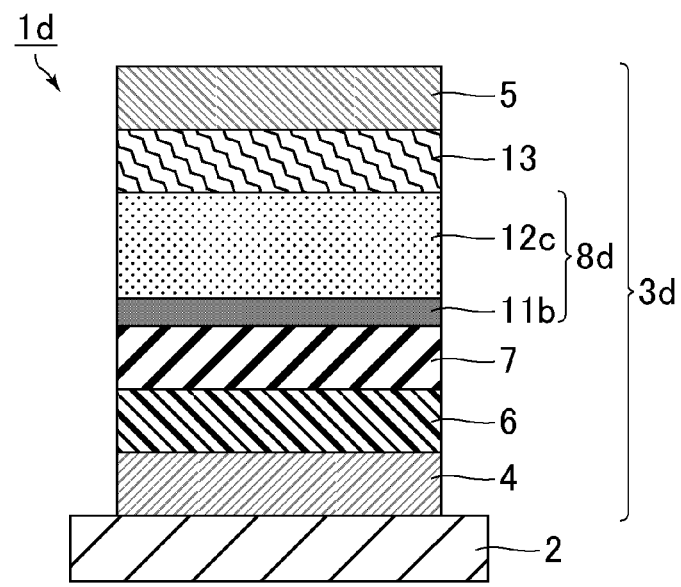
FIG. 8 is a schematic cross-sectional view illustrating an organic EL display panel of Example 4.

FIG. 8 is a schematic cross-sectional view illustrating an organic EL display panel of Example 4. As illustrated in FIG. 8, an organic EL display panel 1d includes the substrate 2 and an organic EL element 3d disposed on the substrate 2. The organic EL element 3d includes the anode 4, the hole injection layer 6, the hole transport layer 7, a light-emitting layer 8d, the doped electron transport layer 13, and the cathode 5 in the order from the substrate 2 side. The light-emitting layer 8d includes the luminescent dopant layer 11b on the anode 4 side and a luminescent host layer 12c on the cathode 5 side. The luminescent host layer 12c is made of two luminescent dopant materials.

The luminescent host layer 12c was a layer obtained by mixing TPBI having bipolarity and high electron transport ability and CBP having hole transport ability at a ratio by weight of 80:20, and had a thickness of 29 nm. The luminescent host layer 12c contains substantially no luminescent dopant material.

Since the light-emitting layer 8d of the organic EL element of Example 4 has the same configuration as the light-emitting layer 8c of the organic EL element of Example 3 except for the configuration of the luminescent host layer, it is apparent that the light-emitting region is limited to a narrow region in the vicinity of the interface between the luminescent dopant layer 11b and the luminescent host layer 12c and thereby the luminous efficacy is sufficiently increased.

Also, since the light-emitting layer 8d is formed without co-deposition of a luminescent dopant material and a luminescent host material, excellent production efficiency can be achieved as in Example 3.

Furthermore, since the organic EL display panel of Example 4 includes the doped electron transport layer 13, the additional effects of Example 3 can be achieved.

The organic EL display panel of Example 4 can further achieve the following additional effects as well as the effects described above.

In the case of using a material having bipolarity and high electron transport ability (hereinafter, such a material is also referred to as a "luminescent host material A") such as the luminescent host material used in Example 3, the number of electrons is greater than the number of holes in the luminescent host layer made of the luminescent host material A, so that electrons can be transported to the luminescent dopant layer. Meanwhile, the luminescent host material A may have low resistance to holes. If holes are injected excessively, holes that were not used in luminescence in the luminescent dopant layer may flow into the luminescent host layer to be accumulated in the luminescent host layer, which may deteriorate the luminescent host material A. In order to avoid such a state, a material having hole transport ability (hereinafter, also referred to as a "luminescent host material B") as well as the luminescent host material A is further added as a material constituting the luminescent host layer. Thereby, holes accumulated in the luminescent host layer can be moved away from the luminescent host material A, so that deterioration of the luminescent host material A can be sufficiently prevented. From the viewpoint of facilitating movement of holes toward the luminescent host material B, the LUMO level of the luminescent host material B is preferably higher than the LUMO level of the luminescent host material A. Also, from the viewpoint of inhibiting movement of electrons toward the luminescent host material B, the HOMO level of the luminescent host material B is preferably higher than the HOMO level of the luminescent host material A.

[Analysis Results]

The element life of the organic EL element constituting the organic EL display panel of each of Examples 3 and 4 was determined. The element life was determined based on the luminance degradation rate during drive time by driving the element while maintaining the current value for an initial luminance of 2000 cd/m$^2$ at ordinary temperature, and monitoring the luminance during driving. The luminance degradation rate was monitored by measuring the luminance with a photodiode using a life-time evaluation system (organic EL device Life-Time Test system, System Giken Co., Ltd.). The results show that the element life of the organic EL element of Example 4 was longer than that of the organic EL element of Example 3. This is presumably because, although holes excessively flow into the luminescent host layer in luminescence with as high an initial luminance as 2000 cd/m$^2$, additional use of the luminescent host material B as in Example 4 suppressed deterioration of the luminescent host material A.

Example 5

Example 5 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Here, the luminescent host layer includes, in the order from the anode side, a mixture layer partially containing a luminescent dopant material and a luminescent host layer containing no luminescent dopant material. The organic EL element of Example 5 is the same as that of Example 3 except for the configuration of the light-emitting layer. Therefore, the same points are not described here.

Figure 9:
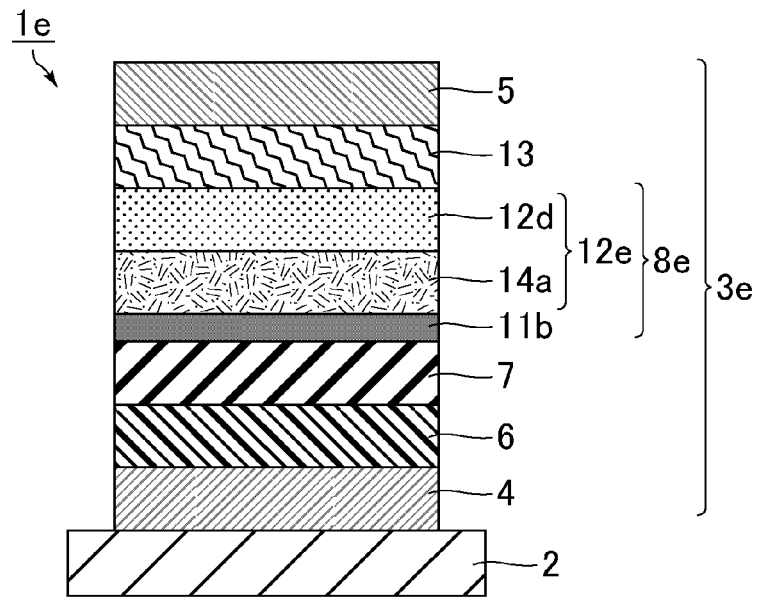
FIG. 9 is a schematic cross-sectional view illustrating an organic EL display panel of Example 5.

FIG. 9 is a schematic cross-sectional view illustrating an organic EL display panel of Example 5. As illustrated in FIG. 9, an organic EL display panel 1e includes the substrate 2 and an organic EL element 3e disposed on the substrate 2. The organic EL element 3e includes the anode 4, the hole injection layer 6, the hole transport layer 7, a light-emitting layer 8e, the doped electron transport layer 13, and the cathode 5 in the order from the substrate 2 side. The light-emitting layer 8e includes the luminescent dopant layer 11b on the anode 4 side and a luminescent host layer 12e on the cathode 5 side. The luminescent host layer 12e includes, in the order from the anode 4 side, a mixture layer 14a obtained by mixing a luminescent dopant material and a luminescent host material and a luminescent host layer 12d containing no luminescent dopant material. The luminescent host layer 12d is the same as the luminescent host layer 12b of Example 3 except that the thickness of the layer 12d was 19 nm.

The mixture layer 14a was obtained by co-deposition of a diamine pyrene-based blue delayed fluorescence material (luminescent dopant material) and a fluorescent material BH-232 (luminescent host material) available from Idemitsu Kosan Co., Ltd. at a ratio by weight of 5:95. The thickness of the mixture layer 14a was 10 nm.

As described in Example 4, holes may flow into the luminescent host layer depending on the applied voltage and the material constituting the hole transport layer, which not only leads to deterioration of the luminescent host material constituting the luminescent host layer but also causes the luminescent host layer itself to generate excitons. The excitons generated within the luminescent host layer emit light by moving with energy to the luminescent dopant layer, but some of the excitons may be scattered to cause the luminescent host material to emit light or be deactivated. As a result, colors may be mixed or the luminous efficacy may be decreased. In order to prevent such disadvantages, a luminescent dopant material is partially mixed into the luminescent host layer, that is, the mixture layer 14a obtained by mixing the luminescent dopant material and the luminescent host material is additionally disposed, so that the excitons generated within the luminescent host layer can also be utilized for luminescence. Thereby, the luminous efficacy can be further increased. Also, since deterioration of the luminescent host material can be sufficiently prevented, the element life of the organic EL element can be lengthened.

Many of the excitons generated in the luminescent host layer are distributed in the vicinity of the interface with the luminescent dopant layer 11b. For this reason, from the viewpoint of further increasing the luminous efficacy, the concentration of the luminescent dopant material in the mixture layer 14a preferably increases from the luminescent host layer 12d side to the luminescent dopant layer 11b side.

Also, since part of the light-emitting layer 8e is formed without co-deposition of a luminescent dopant material and a luminescent host material, excellent production efficiency can be achieved as in Example 3.

Furthermore, since the organic EL display panel of Example 5 includes the doped electron transport layer 13, the additional effects of Example 3 can be achieved.

[Analysis Results]

The element life of the organic EL element constituting the organic EL display panel of each of Examples 3 and 5 with an initial luminance of 2000 cd/m² was determined. The results show that the element life of the organic EL element of Example 5 was longer than that of the organic EL element of Example 3. This is because the mixture layer 14a disposed caused the excitons generated in the luminescent host layer to be efficiently utilized in luminescence.

Example 6

Example 6 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Here, the luminescent host layer includes, in the order from the anode side, a mixture layer partially containing a luminescent dopant material and a luminescent host layer containing no luminescent dopant material. The organic EL element of Example 6 is the same as that of Example 5 except for the configuration of the light-emitting layer. Therefore, the same points are not described here.

Figure 10:
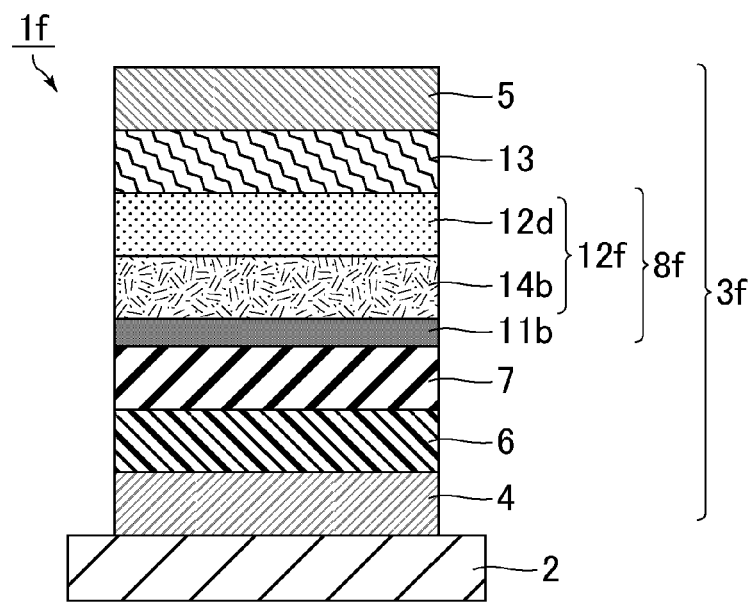
FIG. 10 is a schematic cross-sectional view illustrating an organic EL display panel of Example 6.

FIG. 10 is a schematic cross-sectional view illustrating an organic EL display panel of Example 6. As illustrated in FIG. 10, an organic EL display panel if includes the substrate 2 and an organic EL element 3f disposed on the substrate 2. The organic EL element 3f includes the anode 4, the hole injection layer 6, the hole transport layer 7, a light-emitting layer 8f, the doped electron transport layer 13, and the cathode 5 in the order from the substrate 2 side. The light-emitting layer 8f includes the luminescent dopant layer 11b on the anode 4 side and a luminescent host layer 12f on the cathode 5 side. The luminescent host layer 12f includes, in the order from the anode 4 side, a mixture layer 14b obtained by mixing a luminescent dopant material and a luminescent host material and the luminescent host layer 12d containing no luminescent dopant material.

The mixture layer 14b was obtained by co-deposition of a diamine pyrene-based blue delayed fluorescence material (luminescent dopant material) and a fluorescent material BH-232 (luminescent host material) available from the Idemitsu Kosan Co., Ltd. and had a thickness of 10 nm. Here, the concentration of the luminescent dopant material in the mixture layer 14b was set to continuously increase from the luminescent host layer 12d side to the luminescent dopant layer 11b side, with a concentration of 0 wt % on the luminescent host layer 12d side and a concentration of 100 wt % on the luminescent dopant layer 11b side. Such a state in which the luminescent dopant material is present at different concentrations in the mixture layer 14b can be achieved by oblique angle deposition.

It is also apparent that the same effects as in Example 5 can be achieved by the organic EL element of Example 6 because the organic EL element of Example 6 is the same as that of Example 5 including the use of a mixture layer obtained by mixing a luminescent dopant material and a luminescent host material, except for the configuration of a light-emitting layer.

[Analysis Results]

The element life of the organic EL element constituting the organic EL display panel of each of Examples 3 and 6 with an initial luminance of 2000 cd/m² was determined. As a result, the element life of the organic EL element of Example 6 was longer than that of the organic EL element of Example 3. This is because the mixture layer 14b disposed caused the excitons generated in the luminescent host layer to be efficiently utilized in luminescence.

Example 7

Example 7 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Here, an electron transport layer, a metal layer, and a p-type oxide layer are disposed in the given order between the luminescent host layer and the cathode. The organic EL element of Example 7 is the same as that of Example 3 except that a layer obtained by laminating the electron transport layer, the metal layer, and the p-type oxide layer in the given order was disposed in place of the doped electron transport layer. Therefore, the same points are not described here.

Figure 11:
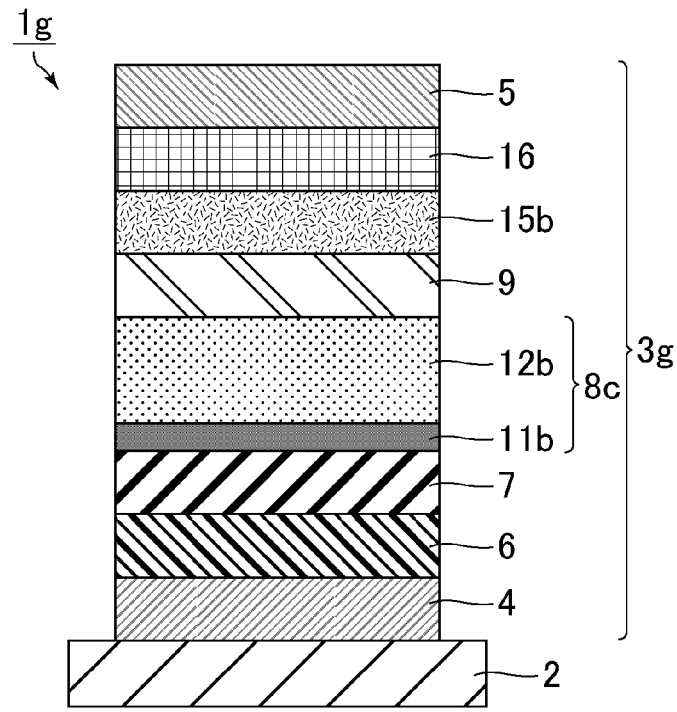
FIG. 11 is a schematic cross-sectional view illustrating an organic EL display panel of Example 7.

FIG. 11 is a schematic cross-sectional view illustrating an organic EL display panel of Example 7. As illustrated in FIG. 11, an organic EL display panel 1g includes the substrate 2 and an organic EL element 3g disposed on the substrate 2. The organic EL element 3g includes the anode 4, the hole injection layer 6, the hole transport layer 7, the light-emitting layer 8c, the electron transport layer 9, a metal layer 15b, a p-type oxide layer 16, and the cathode 5 in the order from the substrate 2 side.

The electron transport layer 9 was made of Bphen and had a thickness of 15 nm. The electron transport layer 9 can also be one included in a common organic EL element.

The metal layer 15b was made of Li and had a thickness of 1 nm. Li was vapor-deposited by an alkali dispenser. The metal layer 15b can also be made of calcium (Ca), for example.

The p-type oxide layer 16 was made of $MoO_3$ and had a thickness of 15 nm. The p-type oxide layer 16 can also be made of vanadium pentoxide ($V_2O_5$), for example.

Since the light-emitting layer 8c of the organic EL element of Example 7 has the same configuration as the light-emitting layer 8c of the organic EL element of Example 3, the organic EL element of Example 7 provide sufficiently increased luminous efficacy, giving excellent production efficiency.

The organic EL display panel of Example 7 can further achieve the following additional effects as well as the effects described above.

Figure 12:
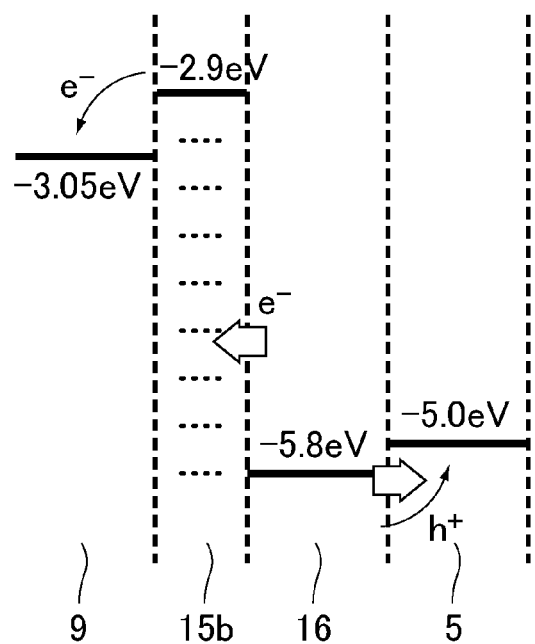
FIG. 12 is a band correlation diagram on the cathode side of the organic EL display panel of Example 7.

The metal layer 15b (Li), the p-type oxide layer 16 ($MoO_3$), and the cathode 5 (ITO) themselves are conductive materials being charged to be ohmically connected to each other, so that charges can be transferred smoothly. The charge transfer is described with reference to FIG. 12. FIG. 12 is a band correlation diagram on the cathode side of the organic EL display panel of Example 7. As illustrated in FIG. 12, the p-type oxide layer 16 ($MoO_3$, work function: −5.8 eV) functions as a charge-generating layer, and can inject electrons into the metal layer 15b (Li) upon receiving holes injected from the cathode 5 (ITO, work function: −5.0 eV). Charges can therefore be smoothly transported from the cathode 5 (ITO) to the metal layer 15b (Li). The LUMO level of the material constituting the electron transport layer 9 is −3.05 eV which is lower than the work function of the metal layer 15b (Li), −2.9 eV. Thus, electrons can be injected from the metal layer 15b (Li) into the electron transport layer 9 without a barrier.

Also, although it depends on the material constituting the doped electron transport layer as described in Example 3, since MoO₃ is an inorganic oxide, the damages on the doped electron transport layer 13 in the formation of the cathode 5 (ITO) on the doped electron transport layer 13 may be larger than the damages on the p-type oxide layer 16 (MoO₃) in the formation of the cathode 5 (ITO) on the p-type oxide layer 16. The configuration of Example 7 can be utilized in such a case so as to enable sufficient prevention of damages in the formation of the cathode 5 (ITO) without doping the material constituting the electron transport layer with a dopant, and to enable injection of electrons from the cathode 5 (ITO) to the electron transport layer 9 side without a barrier.

[Analysis Results]

The property (drive voltage) of the organic EL element constituting the organic EL display panel of each of Examples 3 and 7 was determined. The drive voltage was determined with a luminance of 1000 cd/m² with an FPD module measurement system (MD series, Otsuka Electronics Co., Ltd.) equipped with a luminance colorimeter (BM-5A, Topcon Technohouse Corp.) as a detector. The results show that the drive voltage of the organic EL element of Example 7 decreased compared to that of the organic EL element of Example 3. This difference was due to the difference between the damage on the p-type oxide layer 16 (MoO₃) and the damage on the doped electron transport layer 13 in Example 3 in the formation of the cathode 5 (ITO). The dopant itself constituting the doped electron transport layer 13 has high activity and high reactivity. Hence, even when the doping amount is increased, a slightly remaining active material may be damaged in the formation of the cathode 5 (ITO). Meanwhile, the p-type oxide layer 16 (MoO₃) has low activity, and thus is hardly damaged in the formation of the cathode 5 (ITO). Also, some materials, when constituting the electron transport layer, may not give the effect from disposing the doped electron transport layer. In this respect, use of the configuration in Example 7 provides an increased number of choices for the material constituting the organic EL element, so that even higher production efficiency can be achieved.

Example 8

Example 8 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Here, an electron transport layer, a metal layer, and a p-type doped layer made of a material doped with a p-type dopant were disposed in the given order between the luminescent host layer and the cathode. The organic EL element of Example 8 is the same as that of Example 7 except that the p-type doped layer was disposed in place of the p-type oxide layer. Therefore, the same points are not described here.

Figure 13:
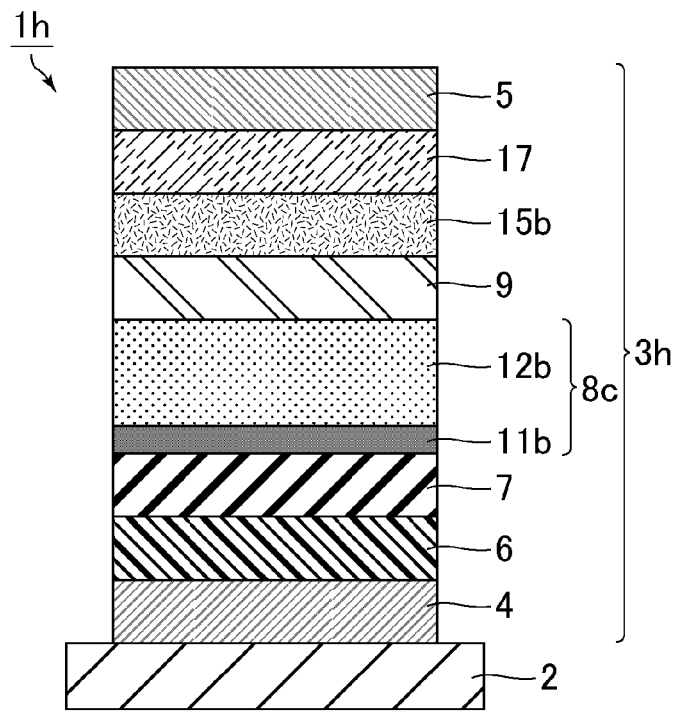
FIG. 13 is a schematic cross-sectional view illustrating an organic EL display panel of Example 8.

FIG. 13 is a schematic cross-sectional view illustrating an organic EL display panel of Example 8. As illustrated in FIG. 13, an organic EL display panel 1h includes the substrate 2 and an organic EL element 3h disposed on the substrate 2. The organic EL element 3h includes the anode 4, the hole injection layer 6, the hole transport layer 7, the light-emitting layer 8c, the electron transport layer 9, the metal layer 15b, a p-type doped layer 17, and the cathode 5 in the order from the substrate 2 side.

The p-type doped layer 17 was a layer obtained by co-deposition of MoO₃ (p-type dopant) and α-NPD which is a material constituting the hole transport layer at a ratio by weight of 20:80, and had a thickness of 15 nm.

Since the light-emitting layer 8c of the organic EL element of Example 8 has the same configuration as the light-emitting layer 8c of the organic EL element of Example 3, the organic EL element of Example 8 can provide sufficiently increased luminous efficacy, giving excellent production efficiency.

The organic EL display panel of Example 8 can further achieve the following additional effects as well as the effects described above.

Figure 14:
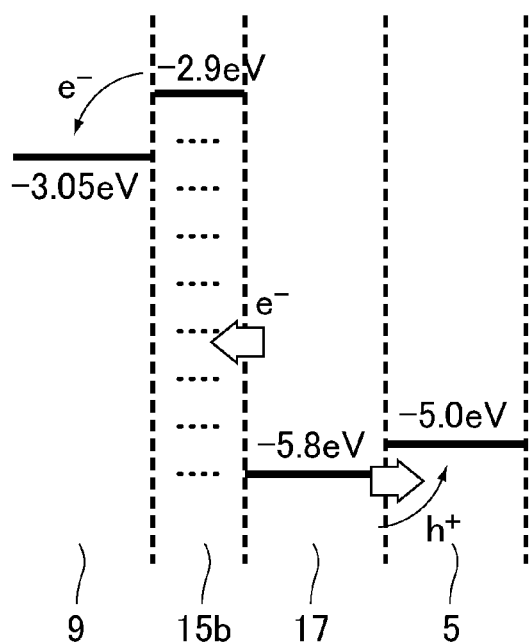
FIG. 14 is a band correlation diagram on the cathode side of the organic EL display panel of Example 8.

As in the case of the p-type doped layer 17, doping a material constituting a hole transport layer with a p-type dopant forms charge transfer complexes. Hence, the p-type doped layer 17 contains a sufficient amount of charges therein. The metal layer 15b (Li), the p-type doped layer 17, and the cathode 5 (ITO) themselves are conductive materials being charged to be ohmically connected to each other, so that charges can be transferred smoothly. The charge transfer is described with reference to FIG. 14. FIG. 14 is a band correlation diagram on the cathode side of the organic EL display panel of Example 8. As illustrated in FIG. 14, the p-type doped layer 17 (work function: −5.8 eV) functions as a charge-generating layer, and can inject electrons into the metal layer 15b (Li) upon receiving holes injected from the cathode 5 (ITO, work function: −5.0 eV). Charges can therefore be smoothly transported from the cathode 5 (ITO) to the metal layer 15b (Li). The LUMO level of the material constituting the electron transport layer 9 is −3.05 eV which is lower than the work function of the metal layer 15b (Li), −2.9 eV. Thus, electrons can be injected from the metal layer 15b (Li) into the electron transport layer 9 without a barrier.

The p-type doped layer 17 is a layer doped with a material (MoO₃) having low activity, and receives a small damage in the formation of the cathode 5 (ITO). Also, although it depends on the material constituting the doped electron transport layer as described in Example 3, the damages on the doped electron transport layer 13 in the formation of the cathode 5 (ITO) on the doped electron transport layer 13 may be larger than the damages on the p-type doped layer 17 in the formation of the cathode 5 (ITO) on the p-type doped layer 17. The configuration of Example 8 can be utilized in such a case so as to enable sufficient prevention of damages in the formation of the cathode 5 (ITO) without doping the material constituting the electron transport layer with a dopant, and to enable injection of electrons from the cathode 5 (ITO) to the electron transport layer 9 side without a barrier.

[Analysis Results]

The properties of the organic EL element constituting the organic EL display panel of each of Examples 3 and 8 were determined. The results show that the drive voltage of the organic EL element of Example 8 decreased compared to that of the organic EL element of Example 3. This difference was due to the difference between the damage on the p-type doped layer 17 and the damage on the doped electron transport layer 13 in Example 3 in the formation of the cathode 5 (ITO). The dopant itself constituting the doped electron transport layer 13 has high activity and high reactivity. Hence, even when the doping amount is increased, a slightly remaining active material may be damaged in the formation of the cathode 5 (ITO). Meanwhile, the p-type doped layer 17 has low activity, and thus is hardly damaged in the formation of the cathode 5 (ITO). Also, some materials, when constituting the electron transport layer, may not give the effect of disposing the doped electron transport layer. In this respect, use of the configuration in Example 8 provides an increased number of choices for the material constituting the organic EL element, so that even higher production efficiency can be achieved.

Also, the same effect can be achieved by disposing a p-type oxide layer such as $MoO_3$ used in Example 7 between the metal layer 15b and the p-type doped layer 17 in the organic EL display panel of Example 8.

Example 9

Example 9 relates to an organic EL element including an anode, a light-emitting layer, and a cathode in the order from the substrate side, and to a top emission organic EL display panel including the organic EL element, wherein the light-emitting layer includes a luminescent dopant layer on the anode side and a luminescent host layer on the cathode side. Here, a doped electron transport layer as described in Example 3 is disposed between the luminescent host layer and the cathode, and the cathode includes a metal layer and a transparent conductive layer in the order from the substrate side. The organic EL element of Example 9 is the same as that of Example 3 except for the configuration of the cathode. Therefore, the same points are not described here.

Figure 15:
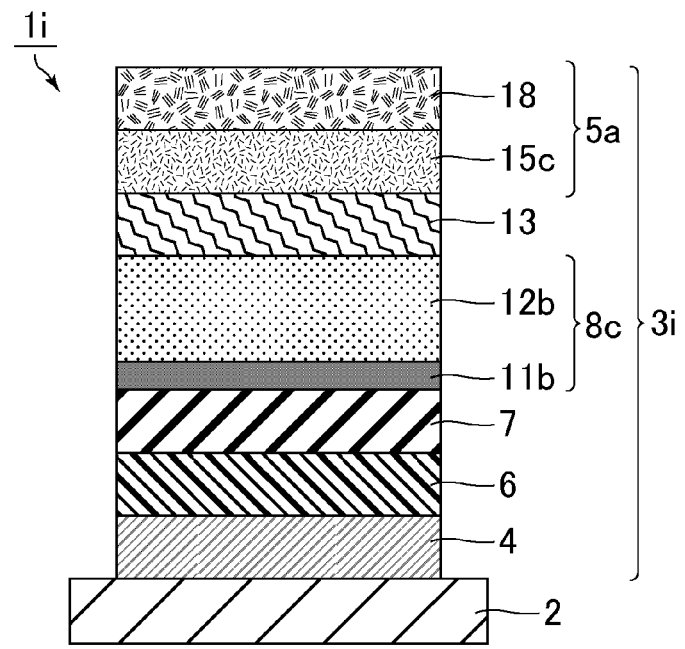
FIG. 15 is a schematic cross-sectional view illustrating an organic EL display panel of Example 9.

FIG. 15 is a schematic cross-sectional view illustrating an organic EL display panel of Example 9. As illustrated in FIG. 15, an organic EL display panel 1i includes the substrate 2 and an organic EL element 3i disposed on the substrate 2. The organic EL element 3i includes the anode 4, the hole injection layer 6, the hole transport layer 7, the light-emitting layer 8c, the doped electron transport layer 13, and a cathode 5a in the order from the substrate 2 side. The cathode 5a includes a metal layer 15c and the transparent conductive layer 18 in the order from the substrate 2 side.

The metal layer 15c constituting the cathode 5a was made of Ag and had a thickness of 19 nm. The metal layer 15c can also be made of any other common metal. The transparent conductive layer 18 constituting the cathode 5a was made of ITO and had a thickness of 100 nm.

Since the light-emitting layer 8c of the organic EL element of Example 9 has the same configuration as the light-emitting layer 8c of the organic EL element of Example 3, the organic EL element of Example 9 can provide sufficiently increased luminous efficacy, giving excellent production efficiency.

The organic EL display panel of Example 9 can further achieve the following additional effects as well as the effects described above.

Ag is transflective but can improve the interference effect, thereby increasing the front-side luminance. Also, use of the metal layer 15c (Ag) enables further prevention of damages on the doped electron transport layer 13 in the formation of the cathode 5 (ITO).

[Analysis Results]

The properties of the organic EL element constituting the organic EL display panel of each of Examples 3 and 9 were determined. The results show that the drive voltage of the organic EL element of Example 9 decreased compared to that of the organic EL element of Example 3. This difference was due to the metal layer 15c (Ag) functioning to protect the doped electron transport layer 13 in the formation of the cathode 5 (ITO), which sufficiently reduced the damage on the doped electron transport layer 13.

[Additional Remarks]

Hereinafter, examples of preferred modes of the organic EL element of the present invention are described. These examples may be appropriately combined within the spirit of the present invention.

The light-emitting layer may include the luminescent dopant layer on the anode side and include the luminescent host layer on the cathode side. Thereby, the luminescent dopant layer and the luminescent host layer can be effectively utilized in accordance with the charge transport ability of the luminescent host material.

The luminescent host material may have bipolarity, and the hole mobility of the luminescent host material may be lower than the electron mobility thereof. The hole mobility and the electron mobility of the luminescent host material are about $10^{-7}$ to $10^{-4}$ $m^2/(V \cdot s)$, and the hole mobility is preferably about $\frac{1}{10}$ of the electron mobility. Thereby, the luminous efficacy can be further increased based on the positions of the luminescent dopant layer and the luminescent host layer. In the case of using multiple luminescent host materials, the maximum value among the hole mobilities is preferably smaller than the minimum value among the electron mobilities in the luminescent host materials.

The light-emitting layer may include the luminescent host layer on the anode side and include the luminescent dopant layer on the cathode side. Thereby, the luminescent dopant layer and the luminescent host layer can be effectively utilized in accordance with the charge transport ability of the luminescent host material.

The luminescent host material may have bipolarity, and the hole mobility of the luminescent host material may be higher than the electron mobility thereof. The hole mobility and the electron mobility of the luminescent host material are about $10^{-7}$ to $10^{-4}$ $m^2/(V \cdot s)$, and the hole mobility is preferably about ten times the electron mobility. Thereby, the luminous efficacy can be further increased based on the positions of the luminescent dopant layer and the luminescent host layer. In the case of using multiple luminescent host materials, the minimum value among the hole mobilities is preferably greater than the maximum value among the electron mobilities in the luminescent host materials.

The luminescent dopant layer may have a thickness of 5 nm or smaller. Such a thickness can further increase the density of excitons, thereby further increasing the luminous efficacy. Also, the amount of the luminescent dopant material can be suppressed by reducing the thickness of the luminescent dopant layer. Hence, even higher production efficiency can be achieved, and mixing of colors between adjacent pixels can be sufficiently prevented.

The luminescent dopant layer may have a concentration of the luminescent dopant material of 90 wt % or higher. In this case, particularly in the case of causing a blue fluorescent material to exhibit delayed fluorescence, the TTF phenomenon can be positively utilized to further increase the luminous efficacy.

Next, examples of preferred modes of the organic EL display panel of the present invention are described. These examples may be appropriately combined within the spirit of the present invention.

The organic electroluminescent display panel may be a top emission organic electroluminescent display panel which emits light from the cathode side. The organic electroluminescent element may include the anode, a hole transport layer, the luminescent dopant layer, the luminescent host layer, a doped electron transport layer, and the cathode in the order from the substrate side. The doped electron transport layer may be made of a material obtained by doping a substance having electron transport ability with a dopant. Such a structure can sufficiently prevent degradation of the electron injection performance from the cathode by utilizing the charged state of the doped electron transport layer itself. Also, disposing a doped electron transport layer enables sufficient prevention of damages on the layers formed before the cathode in the formation of the cathode.

The dopant may be an n-type impurity. Thereby, electrons can be suitably transported by the doped electron transport layer.

The lowest triplet state energy level of a material constituting the hole transport layer may be higher than the lowest triplet state energy level of the luminescent dopant material. Thereby, holes can be transported from the hole transport layer to the luminescent dopant layer without a barrier. In the case that the material constituting the hole transport layer includes multiple materials and the luminescent dopant material includes multiple materials, the minimum value among the lowest triplet state energy levels of the materials constituting the hole transport layer is preferably higher than the maximum value among the lowest triplet state energy levels of the luminescent dopant materials.

The luminescent host layer may contain at least two luminescent host materials. The at least two luminescent host materials may include a material having electron transport ability and a material having hole transport ability. In this structure, the luminescent host layer can be effectively utilized by the effect of sufficiently preventing deterioration of the material having electron transport ability by the material having hole transport ability.

The highest occupied molecular orbital level of the material having hole transport ability may be higher than the highest occupied molecular orbital level of the material having electron transport ability. In this case, the luminescent host layer can be effectively utilized by the effect of inhibiting electrons from moving toward the material having hole transport ability. In the case that the material having hole transport ability includes multiple materials and the material having electron transport ability includes multiple materials, the minimum value among the highest occupied molecular orbital levels of the materials having hole transport ability is preferably higher than the maximum value among the highest occupied molecular orbital levels of the materials having electron transport ability.

The lowest unoccupied molecular orbital level of the material having hole transport ability may be higher than the lowest unoccupied molecular orbital level of the material having electron transport ability. In this case, the luminescent host layer can be effectively utilized by the effect of facilitating movement of holes toward the material having hole transport ability. In the case that the material having hole transport ability includes multiple materials and the material having electron transport ability includes multiple materials, the minimum value among the lowest unoccupied molecular orbital levels of the materials having hole transport ability is preferably higher than the maximum value among the lowest unoccupied molecular orbital levels of the materials having electron transport ability.

The luminescent host layer may include a mixture layer on the anode side, and the mixture layer may be a layer obtained by mixing a luminescent dopant material and a luminescent host material. Thereby, excitons generated in the luminescent host layer can also be utilized in luminescence, so that the luminous efficacy can be further increased. Also, deterioration of the luminescent host material can be sufficiently prevented, whereby the element life of the organic EL element can be lengthened.

The concentration of the luminescent dopant material in the mixture layer may be increased from the cathode side to the anode side. Thereby, excitons distributed in the vicinity of the interface between the luminescent dopant layer and the mixture layer, as well as the excitons generated in the luminescent host layer, can be efficiently utilized in luminescence, and therefore the luminous efficacy can be further increased. Also, since deterioration of the luminescent host material can be sufficiently prevented, the element life of the organic EL element can be lengthened.

The organic electroluminescent display panel may be a top emission organic electroluminescent display panel which emits light from the cathode side. The organic electroluminescent element may include the anode, a hole transport layer, the luminescent dopant layer, the luminescent host layer, an electron transport layer, a metal layer, a p-type oxide layer, and the cathode in the order from the substrate side. Thereby, electrons can be transported from the cathode to the electron transport layer side without a barrier. Also, the p-type oxide layer disposed enables sufficient prevention of damages on the layers formed before the cathode in the formation of the cathode.

The organic electroluminescent display panel may be a top emission organic electroluminescent display panel which emits light from the cathode side. The organic electroluminescent element may include the anode, a hole transport layer, the luminescent dopant layer, the luminescent host layer, an electron transport layer, a metal layer, a p-type doped layer, and the cathode in the order from the substrate side. The p-type doped layer may be made of a material doped with a p-type dopant. Thereby, electrons can be transported from the cathode to the electron transport layer side without a barrier. Also, the p-type doped layer disposed enables sufficient prevention of damages on the layers formed before the cathode in the formation of the cathode.

The p-type doped layer may be made of a material obtained by doping a substance having hole transport ability with the p-type dopant described above. Thereby, the p-type doped layer can be effectively utilized by the effect that the p-type doped layer contains a sufficient amount of charges therein.

The work function of the metal layer may be higher than the lowest unoccupied molecular orbital level of the material constituting the electron transport layer. Thereby, electrons can be transported from the metal layer to the electron transport layer without a barrier. In the case that the material constituting the electron transport layer include multiple materials, the work function of the metal layer is preferably higher than the maximum value among the lowest unoccupied molecular orbital levels of the materials constituting the electron transport layer.

The cathode may include a metal layer and a transparent conductive layer in the order from the substrate side. Thereby, damages on the layers formed before the cathode can be sufficiently prevented in the formation of the cathode.

Examples of the preferred modes of the organic EL display panel of the present invention have been described above. Here, the examples of the modes relating to the features of organic EL elements are also examples of preferred modes of the organic EL element of the present invention.

REFERENCE SIGNS LIST 1a, 1b, 1c, 1d, 1e, 1f, 1g, 1h, 1i, 101a, 101b, 101c: organic EL display panel
2: substrate
3a, 3b, 3c, 3d, 3e, 3f, 3g, 3h, 3i, 103a, 103b, 103c: organic EL element
4: anode
5, 5a, 105: cathode
6: hole injection layer
7: hole transport layer 8a, 8b, 8c, 8d, 8e, 8f, 108a, 108b: light-emitting layer
9: electron transport layer
10: electron injection layer
11a, 11b: luminescent dopant layer
12a, 12b, 12c, 12d, 12e, 12f: luminescent host layer
13: doped electron transport layer
14a, 14b, 114a: mixture layer
15a, 15b, 15c: metal layer
16: p-type oxide layer
17: p-type doped layer
18: transparent conductive layer
19: luminescent dopant material
20: luminescent host material
ER1, ER2, ER3: light-emitting region

The invention claimed is:

1. An organic electroluminescent display panel comprising:
a substrate; and
an organic electroluminescent element disposed on the substrate; wherein
the organic electroluminescent element includes, in the following order:
an anode;
a light-emitting layer; and
a cathode,
the light-emitting layer includes a luminescent dopant layer and a luminescent host layer,
the luminescent dopant layer contains a luminescent dopant material,
the luminescent host layer contains a luminescent host material,
the organic electroluminescent display panel is a top side emission organic electroluminescent display panel which emits light from the cathode side,
the organic electroluminescent element includes the anode, a hole transport layer, the luminescent dopant layer, the luminescent host layer, a doped electron transport layer, and the cathode in the order from the substrate side,
the doped electron transport layer is made of a material obtained by doping a substance having electron transport ability with a dopant, and
the lowest triplet state energy level of a material constituting the hole transport layer is higher than the lowest triplet state energy level of the luminescent dopant material.

2. The organic electroluminescent display panel according to claim 1,
wherein the luminescent host material has bipolarity, and
the hole mobility of the luminescent host material is lower than the electron mobility thereof.

3. The organic electroluminescent display panel according to claim 1,
wherein the luminescent dopant layer has a thickness of 5 nm or smaller.

4. The organic electroluminescent display panel according to claim 1,
wherein the luminescent dopant layer has a concentration of the luminescent dopant material of 90 wt % or higher.

5. The organic electroluminescent display panel according to claim 1,
wherein the dopant is an n-type impurity.

6. The organic electroluminescent display panel according to claim 1,
wherein the luminescent dopant material is a blue fluorescent material exhibiting delayed fluorescence.

7. An organic electroluminescent display panel comprising:
a substrate; and
an organic electroluminescent element disposed on the substrate, wherein
the organic electroluminescent element includes, in the following order:
an anode;
a light-emitting layer; and
a cathode,
the light-emitting layer includes a luminescent dopant layer and a luminescent host layer,
the luminescent dopant layer contains a luminescent dopant material,
the luminescent host layer contains at least two luminescent host materials,
the organic electroluminescent display panel is a top side emission organic electroluminescent display panel which emits light from the cathode side,
the organic electroluminescent element includes the anode, a hole transport layer, the luminescent dopant layer, the luminescent host layer, a doped electron transport layer, and the cathode in the order from the substrate side,
the doped electron transport layer is made of a material obtained by doping a substance having electron transport ability with a dopant,
the at least two luminescent host materials include a material having electron transport ability and a material having hole transport ability, and
the highest occupied molecular orbital level of the material having hole transport ability is higher than the highest occupied molecular orbital level of the material having electron transport ability.

8. The organic electroluminescent display panel according to claim 7,
wherein the at least two luminescent host materials include a material having bipolarity, and
the hole mobility of the material having bipolarity is lower than the electron mobility thereof.

9. The organic electroluminescent display panel according to claim 7,
wherein the luminescent dopant layer has a thickness of 5 nm or smaller.

10. The organic electroluminescent display panel according to claim 7,
wherein the luminescent dopant layer has a concentration of the luminescent dopant material of 90 wt % or higher.

11. The organic electroluminescent display panel according to claim 7,
wherein the dopant is an n-type impurity.

12. The organic electroluminescent display panel according to claim 7,
wherein the luminescent dopant material is a blue fluorescent material exhibiting delayed fluorescence.

13. An organic electroluminescent display panel comprising:
a substrate; and
an organic electroluminescent element disposed on the substrate, wherein
the organic electroluminescent element includes, in the following order:
an anode;
a light-emitting layer; and
a cathode, the light-emitting layer includes a luminescent dopant layer and a luminescent host layer, the luminescent dopant layer contains a luminescent dopant material, the luminescent host layer contains at least two luminescent host materials, the organic electroluminescent display panel is a top side emission organic electroluminescent display panel which emits light from the cathode side, the organic electroluminescent element includes the anode, a hole transport layer, the luminescent dopant layer, the luminescent host layer, a doped electron transport layer, and the cathode in the order from the substrate side, the doped electron transport layer is made of a material obtained by doping a substance having electron transport ability with a dopant, the at least two luminescent host materials include a material having electron transport ability and a material having hole transport ability, and the lowest unoccupied molecular orbital level of the material having hole transport ability is higher than the lowest unoccupied molecular orbital level of the material having electron transport ability.

14. The organic electroluminescent display panel according to claim 13,
wherein the at least two luminescent host materials include a material having bipolarity, and
the hole mobility of the material having bipolarity is lower than the electron mobility thereof.

15. The organic electroluminescent display panel according to claim 13,
wherein the luminescent dopant layer has a thickness of 5 nm or smaller.

16. The organic electroluminescent display panel according to claim 13,
wherein the luminescent dopant layer has a concentration of the luminescent dopant material of 90 wt % or higher.

17. The organic electroluminescent display panel according to claim 13,
wherein the dopant is an n-type impurity.

18. The organic electroluminescent display panel according to claim 13, wherein the luminescent dopant material is a blue fluorescent material exhibiting delayed fluorescence.

* * * * *